(12) United States Patent
Park et al.

(10) Patent No.: US 9,666,324 B2
(45) Date of Patent: May 30, 2017

(54) TRANSPARENT CONDUCTIVE THIN FILM (71) Applicant: Samsung Electronics Co., Ltd., Suwon-Si, Gyeonggi-Do (KR)

(72) Inventors: Hyeon Cheol Park, Hwaseong-si (KR); Kwang Hee Kim, Seoul (KR); Chan Kwak, Gyeonggi-do (KR); Yoon Chul Son, Hwaseong-si (KR); Sang Mock Lee, Yong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 97 days.

(21) Appl. No.: 14/461,639

(22) Filed: Aug. 18, 2014

(65) Prior Publication Data
US 2015/0155065 A1  Jun. 4, 2015

(30) Foreign Application Priority Data
Nov. 29, 2013 (KR) .................. 10-2013-0147806

(51) Int. Cl.
| | |
|---|---|
| *C23C 14/34* | (2006.01) |
| *H01B 1/02* | (2006.01) |
| *H01B 1/06* | (2006.01) |
| *C23C 14/00* | (2006.01) |
| *H01L 31/18* | (2006.01) |
| *C23C 14/06* | (2006.01) |
| *H01B 1/16* | (2006.01) |
| *H01L 33/42* | (2010.01) |
| *H01L 51/52* | (2006.01) |

(52) U.S. Cl.
CPC ............ *H01B 1/02* (2013.01); *C23C 14/0036* (2013.01); *C23C 14/0641* (2013.01); *C23C 14/3414* (2013.01); *C23C 14/3464* (2013.01); *H01B 1/06* (2013.01); *H01B 1/16* (2013.01); *H01L 31/1892* (2013.01); *H01L 33/42* (2013.01); *H01L 51/5234* (2013.01); *Y10T 428/26* (2015.01)

(58) Field of Classification Search
CPC C22C 1/00; C22C 14/00; C22C 16/00; C22C 18/00; C22C 2202/00; H01L 31/1884; H01L 31/1888; H01L 31/022466; H01L 31/022475; H01L 2251/305; H01L 2251/308; H01L 51/442; H01L 51/5215; H01L 51/5234; H01L 33/42
USPC ................. 257/59, 72, E33.064, E31.126
See application file for complete search history.

(56) References Cited

U.S. PATENT DOCUMENTS

| | | | | |
|---|---|---|---|---|
| 6,632,696 | B2 * | 10/2003 | Kimura ............. | G02F 1/134363 438/30 |
| 7,699,965 | B2 * | 4/2010 | Ikisawa ................. | C04B 35/453 106/425 |
| 7,972,684 | B2 | 7/2011 | Hara et al. | |

(Continued)

FOREIGN PATENT DOCUMENTS

| | | |
|---|---|---|
| JP | 06338391 A | 12/1994 |
| JP | 4592829 B1 | 12/2010 |

*Primary Examiner* — Jerome Jackson, Jr.
*Assistant Examiner* — David Spalla
(74) *Attorney, Agent, or Firm* — Harness, Dickey & Pierce, P.L.C.

(57) ABSTRACT

A transparent conductive thin film and an electronic device including the same are disclosed, the transparent conductive thin film including a titanium nitride or a zirconium nitride having a heterometal element selected from zinc (Zn), gallium (Ga), indium (In), and a combination thereof.

12 Claims, 3 Drawing Sheets

(56) References Cited

U.S. PATENT DOCUMENTS

| | | | |
|---|---|---|---|
| 2005/0029088 A1* | 2/2005 | Delahoy | C23C 14/08 204/192.12 |
| 2006/0163567 A1 | 7/2006 | Park et al. | |
| 2006/0208264 A1 | 9/2006 | Ryu et al. | |
| 2011/0256701 A1* | 10/2011 | Xu | H01L 21/28088 438/586 |
| 2013/0230731 A1* | 9/2013 | Nagamoto | H01L 31/02246 428/447 |

* cited by examiner

TRANSPARENT CONDUCTIVE THIN FILM

CROSS-REFERENCE TO RELATED APPLICATION

This application claims priority from Korean Patent Application No. 10-2013-0147806, filed in the Korean Intellectual Property Office on Nov. 29, 2013, the entire contents of which are incorporated herein by reference.

BACKGROUND

1. Field

Example embodiments relate to transparent conductive thin films and electronic devices including the same.

2. Description of the Related Art

Electronic devices such as flat panel displays (e.g., a liquid crystal display and a light emitting diode display), touch screen panels, photovoltaic cells, and transparent transistors typically include transparent electrodes. Materials for the transparent electrode may be required to have a high transmittance of, for example, at least 80% and a low specific resistivity of, for example, $1 \times 10^{-3}$ or lower. The currently available materials for the transparent electrode include indium tin oxide (ITO), tin oxide ($SnO_2$), zinc oxide (ZnO), and the like. The ITO is an n-type semiconductor having an increased concentration of electrons due to the presence of $SnO_2$. Electrical and optical characteristics of the ITO may depend on the electron concentration, the optical bandgap, the mobility of the electrons, and the like. The ITO may include a solid solution compound being composed of $In_2O_3$ at 90 wt % and $SnO_2$ at 10 wt %, and may exhibit a high level of carrier concentration. However, the ITO tends to have poor flexibility, and limited reserves of indium may lead to an increasing cost thereof. As a result, an urgent need to develop a material that may substitute for the ITO remains. Tin oxides (e.g., $SnO_2$) are less expensive than ITO and are chemically stable but may not be etched easily, their resistivity is higher than the resistivity of indium oxide and zinc oxide, and they may require a high processing temperature. Zinc oxide is reported to have a transmittance and an electrical conductivity that are comparable to the transmittance and the electrical conductivity of ITO, but it is chemically unstable and may not provide a high etching ratio and a well-defined pattern when it is subjected to a wet etching process. In particular, electronic devices such as OLEDs may require a transparent electrode being prepared by a vapor deposition at room temperature. However, most of the transparent electrodes deposited at room temperature tend to be amorphous or to have lower crystallinity, which may lead to a lower conductivity and a higher sheet resistance. Therefore, it is desirable to develop an electrode material that may show high transmittance and enhanced conductivity even when it is formed by deposition at room temperature.

SUMMARY

Example embodiments of the present disclosure relate to a nitride-based transparent electrode material having high conductivity and excellent light transmittance.

Example embodiments of the present disclosure relate to a method of producing the nitride-based transparent electrode material.

Example embodiments of the present disclosure relate to an electronic device including the transparent electrode material.

According to at least one example embodiment of the present disclosure, a transparent conductive thin film includes a titanium nitride or a zirconium nitride having a heterometal element selected from zinc (Zn), gallium (Ga), indium (In), and a combination thereof.

The titanium nitride or the zirconium nitride may be represented by Chemical Formula 1:

$$A_{1-x}Me_xN_y \qquad \text{[Chemical Formula 1]}$$

wherein A is titanium (Ti) or zirconium (Zr), Me is zinc (Zn), gallium (Ga), indium (In), or a combination thereof, x is a number between 0.01 and 0.5, and y is a number between 0.8 and 1.2.

In Chemical Formula 1, x may be a number between 0.1 and 0.5.

The transparent conductive thin film may have specific resistivity of less than about $10^{-2}$ $\Omega$*cm.

The transparent conductive thin film may have transmittance of greater than or equal to about 60% with respect to light of a wavelength of about 550 nm.

The transparent conductive thin film may have a thickness of less than or equal to about 150 nm.

Another example embodiment of the present disclosure relates to a method of producing a transparent conductive thin film including a titanium nitride or a zirconium nitride, which includes
obtaining a titanium or zirconium metal target and a heterometal nitride target selected from $Zn_3N_2$, InN, and GaN, and conducting reactive co-sputtering with the titanium or zirconium metal target and the heterometal nitride target and a sputtering gas including nitrogen gas and an inert gas to form a transparent conductive thin film including a titanium nitride or a zirconium nitride on a substrate, wherein the titanium nitride or the zirconium nitride has a metal element selected from zinc (Zn), gallium (Ga), indium (In), and a combination thereof.

The sputtering gas may include argon as the inert gas.

The sputtering gas may have a volume ratio of the nitrogen gas to the inert gas ($N_2$/the inert gas) of greater than or equal to about 0.1.

Another example embodiment of the present disclosure relates to an electronic device including a transparent conductive thin film which includes a titanium nitride or a zirconium nitride having a heterometal element selected from zinc (Zn), gallium (Ga), indium (In), and a combination thereof.

The electronic device may be a flat panel display, a touch screen panel, a photovoltaic cell, an e-window, a heat mirror, a transparent transistor, or a flexible display.

According to example embodiments, it becomes possible to provide a nitride-based, transparent conductive material having enhanced light transmittance to visible light while maintaining high conductivity. The nitride-based transparent conductive material may have a conductivity and a transmittance that are comparable to ITO, and may be prepared by deposition at room temperature. Therefore, the nitride-based transparent conductive material holds a greater potential to be used as an alternative material to ITO.

DETAILED DESCRIPTION

Advantages and characteristics of this example disclosure, and an example method for achieving the same, will become evident referring to the following example embodiments together with the drawings attached hereto. However, this disclosure may be embodied in many different forms and is not to be construed as limited to the example embodiments set forth herein; rather, these example embodiments are provided so that this disclosure will satisfy applicable legal requirements. Therefore, in some example embodiments, well-known process technologies are not explained in detail in order to avoid vague interpretation of the example embodiments. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Further, the singular includes the plural unless otherwise mentioned.

In an example embodiment, a transparent conductive thin film may include a titanium nitride or a zirconium nitride having a heterometal element selected from zinc (Zn), gallium (Ga), indium (In), and a combination thereof.

The titanium nitride or the zirconium nitride may be represented by Chemical Formula 1:

$$A_{1-x}Me_xN_y \qquad \text{[Chemical Formula 1]}$$

wherein A is titanium (Ti) or zirconium (Zr), Me is zinc (Zn), gallium (Ga), indium (In), or a combination thereof, x is a number between 0.01 and 0.5, and y may represent the molar amount of nitrogen, which forms the titanium nitride or the zirconium nitride. Y may be a number between 0.8 and 1.2.

In Chemical Formula 1, x may be from about 0.1 to about 0.5, for example, from about 0.2 to about 0.5.

Although conventional titanium nitride or zirconium nitride may exhibit a high level of conductivity (e.g., a low resistivity of 3 to $5 \times 10^{-5}$ $\Omega$*cm) and is used as an electrode material, the light transmittance thereof is typically not high enough to be used as a transparent conductive material. For example, titanium nitride has a much poorer transmittance in comparison with the ITO. Therefore, in order for a titanium-based nitride compound to be used as a transparent electrode material, its light transmittance (for example, transmittance to visible light) should be enhanced.

Titanium nitride and zirconium nitride, which have a high level of electron concentration, may show high conductivity. The transparent conductive thin films of the example embodiments include a titanium-based nitride (or the zirconium-based nitride) that is added and/or substituted with $Zn_3N_2$, GaN, or InN to form a novel titanium-based nitride (or zirconium-based nitride) having a heterometal element selected from zinc (Zn), gallium (Ga), indium (In), and a combination thereof. Without wishing to be bound by any theory, it is believed that even though such addition and/or substitution may cause a change in carrier concentration of the resulting material, the combination may increase the carrier mobility or the bandgap, and thereby the resulting material may have a higher transmittance while maintaining its high conductivity.

Therefore, the titanium or zirconium nitride-based transparent conductive thin film of the aforementioned example embodiment may have a specific resistivity of less than about $10^{-2}$ $\Omega$*cm, for example, less than or equal to about $9 \times 10^{-3}$ $\Omega$*cm, less than or equal to about $8 \times 10^{-3}$ $\Omega$*cm, or less than or equal to about $5 \times 10^{-3}$ $\Omega$*cm. At the same time, the transmittance of the transparent conductive thin film with respect to light of a wavelength of 550 nm may be greater than or equal to about 60%, for example, greater than or equal to about 70%, or greater than or equal to about 80%. The transparent conductive thin film has a thickness of less than or equal to about 150 nm, for example, less than or equal to about 120 nm, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm. The thickness may have an effect on the light transmittance of the thin film.

In another example embodiment, the method of producing a transparent thin film having a titanium nitride or a zirconium nitride includes
obtaining a titanium or zirconium metal target and a heterometal nitride target selected from $Zn_3N_2$, InN, and GaN, and conducting reactive co-sputtering with the titanium or zirconium metal target and the heterometal nitride target and with a sputtering gas including a nitrogen gas and an inert gas in order to form a transparent conductive thin film including a titanium nitride or a zirconium nitride on a substrate, wherein the titanium nitride or the zirconium nitride has a heterometal element selected from zinc (Zn), gallium (Ga), indium (In), and a combination thereof.

Figure 1:
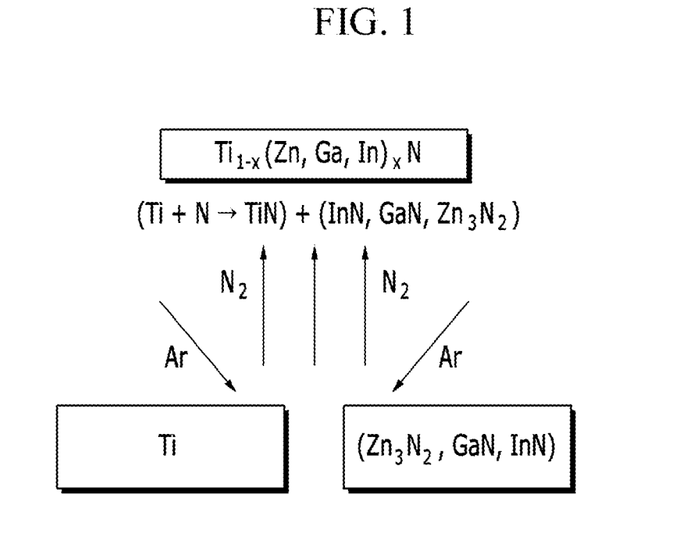
FIG. 1 is a view schematically illustrating formation of a titanium nitride thin film including a heterometal element by co-sputtering in accordance with an example embodiment.

As a sputtering apparatus, any known or commercially available apparatus for co-sputtering may be used. For example, it is possible to use a magnetron sputtering apparatus equipped with an RF and DC power supply, but it is not limited thereto. In addition, the deposition of the thin film including the titanium nitride and the zirconium nitride may be carried out using thermal evaporation, chemical vapor deposition (CVD), atomic layer deposition (ALD), and the like. An apparatus for such deposition is commercially available. FIG. 1 schematically illustrates a non-limiting example of a method of forming a titanium nitride having a heterometal via co-sputtering. With reference to FIG. 1, a voltage is applied to the Ti or Zr target and the heterometal nitride target under an atmosphere including nitrogen and argon in order to form a thin film of a titanium- (or zirconium-) based nitride including a desired amount of the heterometal element.

The Ti or Zr metal target and the heterometal nitride target may be produced in any known method, or is commercially available.

The inert gas may include argon (Ar), helium (He), neon (Ne), krypton (Kr), or a combination thereof, and for example, it may include argon. The ratio of the nitrogen gas to the inert gas in the sputtering gas (for example, $N_2$/Ar in case of using argon as the inert gas) may be greater than or equal to about 0.1, for example greater than or equal to about 0.2, greater than or equal to about 0.3, or greater than or equal to about 0.4. The ratio of the nitrogen gas to the inert gas in the sputtering gas (for example, $N_2$/Ar in case of using argon as the inert gas) may be less than or equal to about 0.6.

Materials and shapes of the substrate are not particularly limited, but may be selected appropriately. For example, the substrate may include an inorganic oxide; quartz; a resin such as polystyrene, polycarbonate, polyolefin, polyethylene terephthalate, polyimide, and the like; a semiconductor such as Si, Ga, and the like; a crystalline material such as a monocrystalline or a polycrystalline material, but it is not limited thereto. The substrate may have any shape.

Conditions for sputtering may be selected appropriately so as to form a titanium or zirconium nitride including a heterometal element in a desired amount. For example, the following procedures may be carried out for controlling the composition in the resulting nitride (e.g., a stoichiometric amount of each element): sputtering conditions such as power, time, and vacuum degree are determined depending on the thickness with respect to TiN (or ZrN) and the heterometal nitride. From the density of each nitride, the atomic concentration (at %) of each element is calculated, and then the sputtering conditions (the power, the time, the vacuum degree, etc.) may be determined to form a thin film of a compound having a desired composition.

As to the manner of applying the voltage, a DC power supply may be used for the Ti or Zr metal target, and an RF power supply may be used for the heterometal nitride target.

The sputtering temperature is not particularly limited, and may be in a range from about 10° C. to about 400° C. The distance between the target and a substrate is not particularly limited, and may be greater than or equal to about 5 cm, for example, may range from 10 cm to 30 cm. The sputtering time may be 5 min or longer, but it is not limited thereto. The thickness of the thin film may be controlled by adjusting the sputtering time.

The thin film thus prepared may be subjected to a post-annealing process in an inert gas and high vacuum atmosphere. The temperature of the post-annealing is not particularly limited, and may be range from about 200° C. to about 500° C.

In other example embodiments, an electronic device including a transparent conductive thin film includes a titanium nitride or a zirconium nitride having a heterometal element selected from zinc (Zn), gallium (Ga), indium (In), and a combination thereof.

Details of the transparent conductive thin film including the titanium or zirconium nitride having the heterometal atom have already been explained above. The electronic device may be a flat panel display, a touch screen panel, a photovoltaic cell, an e-window, a heat mirror, a transparent transistor, or a flexible display.

The following examples illustrate one example embodiment in more detail. However, it is understood that the scope of the example embodiment is not limited to these examples.

EXAMPLES

Reference Example 1

Formation of a TiN Thin Film by Reactive Sputtering

A TiN thin film is formed using a titanium metal target and a mixture of nitrogen ($N_2$) gas and argon (Ar) gas as a sputtering gas under the following conditions.
Sputtering apparatus: DC/RF magnetron sputter (manufactured by Samhan Vacuum Co. Ltd., model name: SHS-2M-3-400TL)
Substrate: Si substrate (for measurement of conductivity)/E-glass (for measurement of transmittance)
Power: 150 W
Time: 10 min
Ti metal target: 99.999% (purity)
In the sputtering apparatus, the Ti metal target is mounted and the chamber is decompressed to $5 \times 10^{-5}$ Pa using a vacuum pump. Then, a desired, or alternatively predetermined volume of argon gas and a desired, or alternatively predetermined volume of nitrogen gas are supplied to the apparatus such that the volume ratio of $N_2$/Ar is the same as set forth in Table 1 and FIG. 2. Sputtering is conducted for 10 minutes by applying a voltage to the target to provide a thin film having a thickness of 50 nm.

Figure 2:
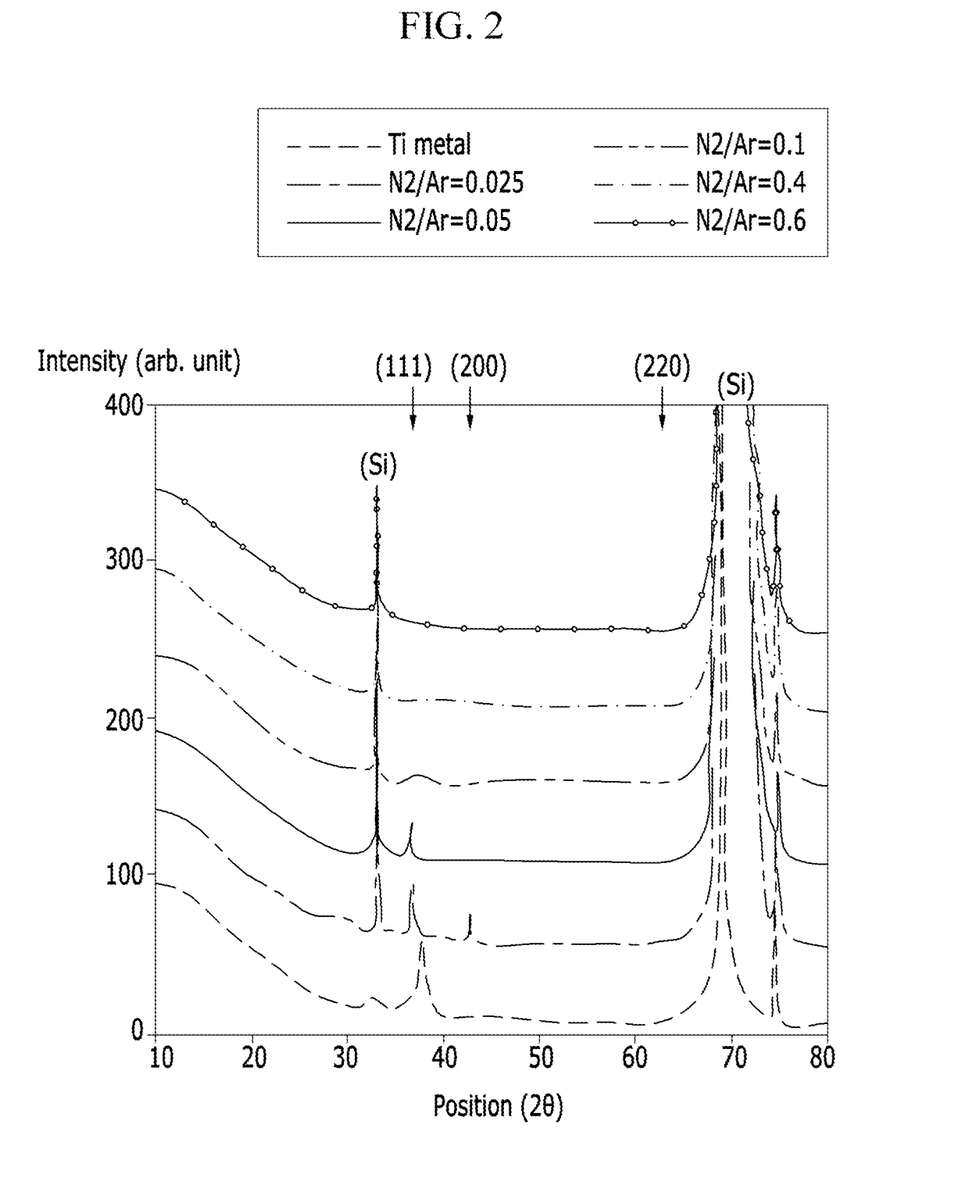
FIG. 2 includes XRD spectrums of TiN thin films prepared in Reference Example 1.

An X-ray diffraction analysis is made for each of the thin films thus obtained, and the results are shown in FIG. 2. In addition, for each of the thin films, specific resistivity and transmittance are measured in accordance with the following manner, and the results are compiled in Table 1.

Conductivity is measured using a Hall effect apparatus (Nanometrics, HL5500PC) in accordance with the 4-probe method. Transmittance is measured using a measuring device for transmittance/haze (manufactured by Nippon Denshoku, model name: NDH-5000) at a wavelength of 550 nm.

TABLE 1

| $N_2$/Ar ratio | Specific resistivity ($\times 10^{-4}$ Ω * cm) | Thickness (nm) | Transmittance (% at 550 nm) |
| --- | --- | --- | --- |
| 0.1 | 4.5 | 50 | 32 |
| 0.2 | 20 | 50 | 43 |
| 0.4 | 92 | 50 | 58 |
| 0.6 | 540 | 50 | 65 |

The results of Table 1 confirm that the obtained TiN thin films have different values of transmittance and conductivity depending on the ratio of $N_2$/Ar on sputtering. According to Table 1, as the ratio of $N_2$/Ar decreases, the specific resistivity and the transmittance also decrease. For example, the TiN thin films formed at a $N_2$/Ar ratio of about 0.1 and about 0.2 may be used as an electrode material in light of specific resistivity, but they may not be used as a transparent electrode material in light of their transmittance.

With reference to FIG. 2, the main peaks of TiN are located at (111), (200), and (220), and when the ratio of $N_2$/Ar is at least about 0.1, a peak at (111) is observed to confirm the formation of crystalline TiN.

Example 1

A thin film of a titanium nitride also including $Zn_3N_2$ is formed using a titanium metal target and a $Zn_3N_2$ target as a sputtering target, and a mixture of nitrogen ($N_2$) and argon (Ar) as a sputtering gas under the following conditions.
Sputtering apparatus: DC/RF magnetron sputter (manufactured by Samhan Vacuum Co. Ltd., model name: SHS-2M-3-400TL)
Substrate: Si substrate (for measurement of conductivity)/E-glass (for measurement of transmittance)
Power: TiN-120 W (DC power), $Zn_3N_2$-20 W (RF power)
Time: 10 min
Ti metal target: 99.999% (purity)
$Zn_3N_2$ target: 99.95% (purity)
In the sputtering apparatus, the Ti metal target and the $Zn_3N_2$ target are mounted, and the chamber is decompressed to $5 \times 10^{-5}$ Pa using a vacuum pump. Then, a desired, or alternatively predetermined volume of argon gas and a desired, or alternatively predetermined volume of nitrogen gas are supplied to the apparatus such that the volume ratio of $N_2$/Ar is controlled to be 0.2. Sputtering is conducted by applying a voltage to the target for 10 min to provide a thin film having a thickness of 40 nm, wherein 10 at % of $Zn_3N_2$ is substituted/added to the titanium nitride (TiN).

Figure 3:
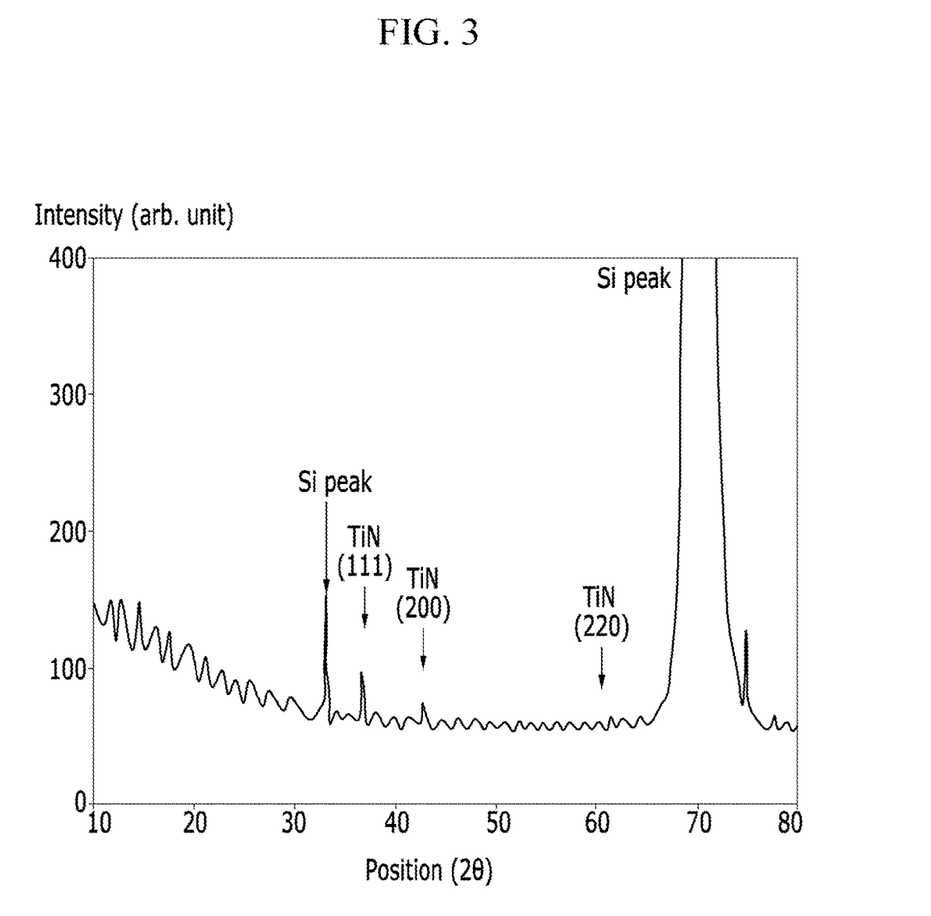
FIG. 3 includes XRD spectrums of the $Ti_{0.9}Zn_{0.1}N$ thin film prepared in Example 1.

An X-ray diffraction analysis is made for the thin film thus obtained, and the results are shown in FIG. 3. In addition, for the thin film, specific resistivity and transmittance are measured in accordance with the same manners as set forth in Reference Example 1, and the results show that the specific resistivity is $72 \times 10^{-4}$ Ω*cm and the transmittance is 75%.

With reference to FIG. 3, the thin film thus obtained has a TiN crystalline structure (FCC).

Example 2

Preparation of Thin Films Having a Composition of $Ti_{1-x}(Zn, in, Ga)_xN$ and Characterization Thereof Thin films having a composition of $Ti_{1-x}(Zn, In, Ga)_xN$ as set forth in Table 2 are formed using a titanium metal target and a heterometal nitride target selected from $Zn_3N_2$, InN, and GaN targets, and a mixture of nitrogen ($N_2$) and argon as a sputtering gas under the following conditions.

Sputtering apparatus: DC/RF magnetron sputter (manufactured by Samhan Vacuum Co. Ltd., model name: SHS-2M-3-400TL)

Substrate: Si substrate (for measurement of conductivity)/E-glass (for measurement of transmittance)

Power: TiN-120 W (DC power), $Zn_3N_2$, InN, GaN-20 W (RF power)

Time: 8 min

Ti metal target: 99.999% (purity)

$Zn_3N_2$ target: 99.95% (purity)

InN target: 99.95% (purity)

GaN target: 99.95% (purity)

In the sputtering apparatus, the Ti metal target and each of the heterometal nitride targets are mounted, and the chamber is decompressed to $5 \times 10^{-5}$ Pa using a vacuum pump. Then, a desired, or alternatively predetermined volume of argon gas and a desired, or alternatively predetermined volume of nitrogen gas are supplied to the apparatus such that the volume ratio of $N_2$/Ar is controlled to be 0.4. Sputtering is conducted for 8 minutes by applying a voltage to the target to provide a thin film having a thickness of 40 nm and having a composition set forth in Table 2.

For each of the thin films thus obtained, specific resistivity and transmittance are measured in accordance with the same manners as set forth in Reference Example 1, and the results are compiled in Table 2.

TABLE 2

| composition | Specific resistivity ($\times 10^{-4}$ Ω * cm) | Thickness (nm) | Transmittance (% at 550 nm) |
| --- | --- | --- | --- |
| TiN | 92 | 40 | 64 |
| $Ti_{0.7}Zn_{0.3}N$ | 35 | 40 | 83 |
| $Ti_{0.7}In_{0.3}N$ | 15 | 40 | 85 |
| $Ti_{0.7}Ga_{0.3}N$ | 65 | 40 | 87 |

From the results of Table 2, the thin films having a composition of $Ti_{1-x}(Zn, In, Ga)_xN$ have significantly enhanced light transmittance in the visible light region while they maintain specific resistivity at a low level.

Example 3

Preparation of Thin Films Having a Composition of $Ti_{1-x}Zn_xN$ and Characterization Thereof Thin films having a composition set forth in Table 3 are formed using a titanium metal target and a $Zn_3N_2$ target, and a mixture of nitrogen ($N_2$) and argon (Ar) as a sputtering gas under the following conditions.

Sputtering apparatus: DC/RF magnetron sputter (manufactured by Samhan Vacuum Co. Ltd., model name: SHS-2M-3-400TL)

Substrate: Si substrate (for measurement of conductivity)/E-glass (for measurement of transmittance)

Power: TiN-120 W (DC power), $Zn_3N_2$-35 W, 50 W, 75 W, or 90 W (RF power)

Time: 8 min

Ti metal target: 99.999% (purity)

$Zn_3N_2$ target: 99.95% (purity)

In the sputtering apparatus, the Ti metal target and the $Zn_3N_2$ target are mounted, and the chamber is decompressed to $5 \times 10^{-5}$ Pa using a vacuum pump. Then, a desired, or alternatively predetermined volume of argon gas and a desired, or alternatively predetermined volume of nitrogen gas are supplied to the apparatus such that the volume ratio of $N_2$/Ar is controlled to be 0.4. Sputtering is conducted by applying a voltage to the target for 8 min to provide a thin film having a thickness of 40 nm and having a composition set forth in Table 3.

For each of the thin films thus obtained, specific resistivity and transmittance are measured in accordance with the same manner as set forth in Reference Example 1, and the results are compiled in Table 3.

TABLE 3

| composition | Specific resistivity ($\times 10^{-4}$ Ω * cm) | Thickness (nm) | Transmittance (% at 550 nm) |
| --- | --- | --- | --- |
| TiN | 92 | 40 | 64 |
| $Ti_{0.9}Zn_{0.1}N$ | 72 | 40 | 75 |
| $Ti_{0.8}Zn_{0.2}N$ | 56 | 40 | 80 |
| $Ti_{0.7}Zn_{0.3}N$ | 35 | 40 | 83 |
| $Ti_{0.6}Zn_{0.4}N$ | 45 | 40 | 82 |
| $Ti_{0.5}Zn_{0.5}N$ | 85 | 40 | 80 |

From the results of Table 3, the thin films having a composition of $Ti_{1-x}Zn_xN$ may show particularly excellent specific resistivity and light transmittance when the amount of Zn is 20 to 50 at % (i.e., when x is 0.2 to 0.5).

Example 4

A thin film having a composition of $Zr_{0.7}Zn_{0.3}N$ is formed using a zirconium metal target and a $Zn_3N_2$ target, and a mixture of nitrogen ($N_2$) and argon (Ar) as a sputtering gas under the following conditions.

Sputtering apparatus: DC/RF magnetron sputter (manufactured by Samhan Vacuum Co. Ltd., model name: SHS-2M-3-400TL)

Substrate: Si substrate (for measurement of conductivity)/E-glass (for measurement of transmittance)

Power: TiN-120 W (DC power), $Zn_3N_2$-35 W, 50 W, 75 W, or 90 W (RF power)

Time: 8 min

Zr metal target: 99.999% (purity)

$Zn_3N_2$ target: 99.95% (purity)

In the sputtering apparatus, the Zr metal target and the $Zn_3N_2$ target are mounted, and the chamber is decompressed to $5 \times 10^{-5}$ Pa using a vacuum pump. Then, a desired, or alternatively predetermined volume of argon gas and a desired, or alternatively predetermined volume of nitrogen gas are supplied to the apparatus such that the volume ratio of $N_2$/Ar is controlled to be 0.4. Sputtering is conducted by applying a voltage to the target for 8 min to provide a thin film having a thickness of 40 nm, wherein Zn is added to/substituted for ZrN in an amount of 30 at %.

For each of the thin films thus obtained, specific resistivity and transmittance are measured in accordance with the same manner as set forth in Reference Example 1, and the results show that the specific resistivity is $110 \times 10^{-4}$ Ω*cm and the transmittance is 75%.

While this disclosure has been described in connection with what is presently considered to be practical example embodiments, it is to be understood that the example embodiments are not limited to the disclosed examples, but, on the contrary, is intended to cover various modifications and equivalent arrangements included within the spirit and scope of the appended claims.

What is claimed is:

1. A transparent conductive thin film comprising:
   at least one of a titanium nitride and a zirconium nitride including a heterometal element selected from zinc (Zn), indium (In), and a combination thereof, wherein the at least one of titanium nitride and zirconium nitride is represented by Chemical Formula 1:

$$A_{1-x}Me_xN_y \qquad \text{[Chemical Formula 1]}$$

wherein A is titanium (Ti) or zirconium (Zr), Me is zinc (Zn), indium (In), or a combination thereof, x is between 0.01 and 0.5, and y is between 0.8 and 1.2, wherein the at least one of the titanium nitride and the zirconium nitride has a face centered cubic (FCC) crystal structure.

2. The transparent conductive thin film of claim 1, wherein the transparent conductive thin film has a specific resistivity of less than about $10^{-2}$ Ω*cm.

3. The transparent conductive thin film of claim 1, wherein the transparent conductive thin film has a transmittance that is greater than or equal to about 60% with respect to light of a wavelength of about 550 nm.

4. The transparent conductive thin film of claim 1, wherein the transparent conductive thin film has a thickness that is less than or equal to about 150 nm.

5. A method of producing a transparent conductive thin film including at least one of a titanium nitride or a zirconium nitride, the method comprising:
obtaining at least one of a titanium and a zirconium metal target and a heterometal nitride target including at least one of $Zn_3N_2$ and InN; and
conducting reactive co-sputtering with the at least one of titanium and zirconium metal target and the heterometal nitride target, using a sputtering gas including nitrogen gas and an inert gas, to form a transparent conductive thin film including at least one of a titanium nitride and a zirconium nitride on a substrate,
wherein the at least one of titanium nitride and zirconium nitride has a heterometal element including one of zinc (Zn), indium (In), and a combination thereof, and
wherein the at least one of the titanium nitride and the zirconium nitride has a face centered cubic (FCC) crystal structure, and
wherein the at least one of titanium nitride and zirconium nitride is represented by Chemical Formula 1:

$$A_{1-x}Me_xN_y \qquad \text{[Chemical Formula 1]}$$

wherein A is titanium (Ti) or zirconium (Zr), Me is zinc (Zn), indium (In), or a combination thereof, x is between 0.1 and 0.5, and y is between 0.8 and 1.2.

6. The method of claim 5, wherein the sputtering gas has a volume ratio of the nitrogen gas to the inert gas ($N_2$/the inert gas) that is greater than or equal to about 0.1.

7. The method of claim 5, wherein the inert gas comprises argon.

8. An electronic device comprising a transparent conductive thin film, wherein the transparent conductive thin film comprises at least one of a titanium nitride and a zirconium nitride having a heterometal element selected from zinc (Zn), indium (In), and a combination thereof, and wherein the at least one of titanium nitride and zirconium nitride is represented by Chemical Formula 1:

$$A_{1-x}Me_xN_y \qquad \text{[Chemical Formula 1]}$$

wherein A is titanium (Ti) or zirconium (Zr), Me is zinc (Zn), indium (In), or a combination thereof, x is between 0.01 and 0.5, and y is between 0.8 and 1.2, and
wherein the at least one of the titanium nitride and the zirconium nitrude has a face centered cubic (FCC) crystal structure.

9. The electronic device of claim 8, wherein the transparent conductive thin film has a specific resistivity that is less than about $10^{-2}$ Ω*cm.

10. The electronic device of claim 8, wherein the transparent conductive thin film has a transmittance that is greater than or equal to about 60% with respect to light of a wavelength of about 550 nm.

11. The electronic device of claim 8, wherein the transparent conductive thin film has a thickness that is less than or equal to about 150 nm.

12. The electronic device of claim 8, wherein the electronic device comprises a flat panel display, a touch screen panel, a photovoltaic cell, an e-window, a heat mirror, or a transparent transistor.

\* \* \* \* \*